US008860456B2

(12) United States Patent
Huang et al.

(10) Patent No.: US 8,860,456 B2
(45) Date of Patent: Oct. 14, 2014

(54) NON-DESTRUCTIVE TILT DATA MEASUREMENT TO DETECT DEFECTIVE BUMPS

(75) Inventors: Sa Huang, Gilbert, AZ (US); Mark E. Henschel, Phoenix, AZ (US)

(73) Assignee: Medtronic, Inc., Minneapolis, MN (US)

( * ) Notice: Subject to any disclaimer, the term of this patent is extended or adjusted under 35 U.S.C. 154(b) by 402 days.

(21) Appl. No.: 13/196,281

(22) Filed: Aug. 2, 2011

(65) Prior Publication Data

US 2013/0033286 A1 Feb. 7, 2013

(51) Int. Cl.
*G01R 31/28* (2006.01)
*G06K 9/00* (2006.01)
*G01R 31/04* (2006.01)

(52) U.S. Cl.
CPC .................................. *G01R 31/046* (2013.01)
USPC .................................................. 324/763.01

(58) Field of Classification Search
None
See application file for complete search history.

(56) References Cited

U.S. PATENT DOCUMENTS

| | | | |
|---|---|---|---|
| 3,671,748 A | 6/1972 | Friedman | |
| 4,641,527 A | 2/1987 | Hiroi et al. | |
| 5,105,149 A | 4/1992 | Tokura | |
| 5,505,090 A | 4/1996 | Webster | |
| 5,598,345 A * | 1/1997 | Tokura | 382/150 |
| 5,760,904 A | 6/1998 | Lorraine et al. | |
| 5,839,187 A | 11/1998 | Sato et al. | |
| 5,859,924 A | 1/1999 | Liu et al. | |
| 5,971,608 A | 10/1999 | Koizumi | |
| 5,999,266 A | 12/1999 | Takahashi et al. | |
| 6,249,598 B1 * | 6/2001 | Honda et al. | 382/150 |
| 6,385,335 B1 | 5/2002 | Rudd et al. | |
| 6,555,836 B1 | 4/2003 | Takahashi et al. | |
| 6,580,518 B2 | 6/2003 | Eda et al. | |
| 6,661,084 B1 | 12/2003 | Peterson et al. | |
| 6,747,268 B1 | 6/2004 | Ume | |
| 6,917,421 B1 | 7/2005 | Wihl et al. | |
| 7,169,627 B2 | 1/2007 | Duh et al. | |
| 7,327,448 B2 | 2/2008 | Klein et al. | |
| 7,486,090 B2 * | 2/2009 | Mori | 324/763.01 |
| 7,676,114 B2 | 3/2010 | Chung et al. | |
| 7,860,633 B2 | 12/2010 | Stubenrauch et al. | |
| 2002/0112530 A1 | 8/2002 | Kitagawa | |
| 2005/0225754 A1 | 10/2005 | Ume et al. | |
| 2010/0290696 A1 * | 11/2010 | Jeong et al. | 382/147 |
| 2011/0051124 A1 | 3/2011 | Wang et al. | |

FOREIGN PATENT DOCUMENTS

JP        2002176292 A  *  6/2002

* cited by examiner

*Primary Examiner* — Vinh Nguyen
(74) *Attorney, Agent, or Firm* — Evans M. Mburu

(57) ABSTRACT

The present disclosure includes techniques and apparatus for making non-contact differential measurements of various dimensions of electronic components surface mounted on circuit boards. Tilt data relating to the electronic components is derived from the differential measurements to provide an indication of the integrity of the electrical connection between the electronic components to the circuit board. The techniques and apparatus of the present disclosure make it possible to accomplish non-destructive inspection of the connection without individually inspecting each bump-terminal connection.

15 Claims, 10 Drawing Sheets

|   | Die tilt (um) 200um reference plane distance | Die tilt 400um reference plane distance |
|---|---:|---:|
| 1 | 51.054 | 58.166 |
| 2 | 50.8 | 57.658 |
| 3 | 58.674 | 51.816 |
| 4 | 55.372 | 32.258 |
| 5 | 50.038 | 22.86 |
| 6 | 51.308 | 46.736 |
| 7 | 62.484 | 42.418 |
| 8 | 60.706 | 42.418 |
| 9 | 45.466 | 16.256 |
| 10 | 50.8 | 60.96 |
| 11 | 52.832 | 39.878 |
| 12 | 48.768 | 32.766 |
| 13 | 51.054 | 24.892 |
| 14 | 55.626 | 24.384 |
| 15 | 45.212 | 40.386 |

Table 1

FIG. 7

NON-DESTRUCTIVE TILT DATA MEASUREMENT TO DETECT DEFECTIVE BUMPS

FIELD

The present disclosure generally relates to methods and apparatus for inspecting integrated circuit boards. More particularly, the disclosure relates to inspecting an attachment between a surface-mounted component and an integrated circuit board provided with bumps serving as mounting terminals.

BACKGROUND

Increasing demand for smaller, more compact, and increasingly complex electronics has driven manufacturers to adopt new technology. In the past decade, there has been wide acceptance of flip chip microelectronic assembly as an integrated circuit package solution. The flip chips are active electronic components offering an extensive ability to incorporate numerous features and capabilities. The assemblies typically include one or more electronic components surface-mounted to a substrate, such as a printed circuit board (PCB). The substrate is used to mechanically support and electrically connect the electronic component using conductive pathways, tracks or signal traces etched from copper sheets laminated onto the non-conductive substrate.

One such surface mount method of inter-connecting the electrical component to the substrate is known as solder bump or ball technology. This interconnection typically makes these circuits superior in performance to other more conventional interconnection technologies. It also facilitates cheap and speedy high-volume production; the production and soldering of PCBs can be done by totally automated equipment. However, significant manufacturing problems exist with the integrity of the connection between the electronic component and the substrate onto which the components are connected.

For the interconnection, a plurality of terminals, such as input/output terminals, is arranged in a pattern on the surface of the electronic component and the electronic component is placed face down and bonded to the substrate. Each terminal must connect properly with the corresponding solder bump on the substrate. These bump terminals are spherical terminals formed on the surface of the substrate; they include metal bumps formed with a plating method and solder bumps formed with a solder dip method. Consequently, it is necessary that the form and height of the bumps be uniform. A height less than other bumps will cause the connection with the electrode on the substrate to be no good. When the height of the bumps is uneven, there is an increased risk of a short circuit between adjacent bumps.

Generally, each electronic component may be provided with numerous bumps, in which case visual inspection of the bumps on each integrated circuit assembly is almost impossible. Nevertheless, it is necessary to find any defects of the bumps onto which the electronic component is mounted. Therefore, various bump inspection techniques have been proposed for automated nondestructive inspection of the solder joint quality of the solder bumps connecting the electronic components. These include x-ray detection methods, acoustic microscopy, and functional testing methods. There are two main types of x-ray detection methods: laminography and microfocus radiography. Acoustic microscopes utilize high-frequency ultrasound to examine the internal features in materials and components. Defects such as preexisting voids or non-wet conditions can be observed. The most widely used on-line inspection techniques are functional testing methods, such as the flying probe or the bed of nails methods. In these techniques, a test fixture checks for electrical continuity and proper operation of the circuit assembly by comparing the electrical response at specific nodes of the assembly to previously determined values. However, unsoldered joints may still pass this test if mechanical contact exists, even though the joint may fail after a short service life because of cracks or partial connections.

These inspection methods also have other drawbacks. The technologies utilized in inspecting the joint defects typically require individual inspection of each bump-terminal connection, which can be time and resource consuming. Moreover, because some of the bump defects typically emerge subsequent to the reflow process, the conventional bump inspection techniques are likely to be misleading since the bump dimensions are generally measured prior to the reflow process.

Other techniques for post-bond inspection such as that disclosed in the Wang et al., US 2011/0051124 publication have generally focused on the alignment of the electronic component relative to the substrate onto which the electronic component is placed. However, even with proper alignment, the electrical connections between the electronic component and substrate bumps may still have defects that would be undiscovered if relying on the alignment data.

Accordingly, there remains a need for a method and apparatus that can provide reliable detection of a defect in a connection between a substrate and an electronic component mounted thereon.

SUMMARY

The following description is exemplary in nature and is not intended to limit the scope, applicability, or configuration of the present disclosure in any way. Rather, the description provides practical illustrations for implementing exemplary embodiments of the present disclosure.

Apparatus and techniques for inspection of flip chip microelectronic assemblies including direct electronic connection of face-down ("flipped") electronic components onto an integrated circuit board ("substrate") by means of solder bumps on the substrate are disclosed. The techniques and apparatus of the present disclosure facilitate non-destructive inspection of the connection without individually inspecting each bump-terminal connection.

In one embodiment, the apparatus comprises laser light means for emitting laser light toward an electronic component to be inspected; laser detection means for detecting the height of an inspection point of the device on the basis of the laser beam reflected from said electronic component and processing means for deriving an indication of tilt based on the measured height data. In the apparatus, the laser light means may project a laser light beam on at least first and second locations to establish a reference plane on the substrate of the integrated circuit assembly. The laser light means may then project the same (or a different) laser light beam onto a top surface of the electronic component mounted on the integrated circuit assembly. The processing means is then operable to compute tilt data based on the relative height difference between the first and second locations as measured from the reference plane to the electronic component. The tilt data may be computed by comparing the relative heights of the electronic component in reference to the reference plane. Based on the tilt data, an indication of an attachment defect may be derived.

According to another aspect of the disclosure, there is provided a technique for inspecting connection of an electronic component relative to a substrate onto which it is placed, comprising the steps of: positioning the electronic component such that a first side of the electronic component which has a circuit pattern formed on it is facing away from an infrared light source of an imaging system; coupling terminals of the electronic component to the substrate via solder bumps with a corresponding circuit bump that are provided on the substrate; projecting infrared light from the infrared light source onto a side of the electronic component such as a vertical side; detecting and capturing laser beam reflection of the electronic component based on the reflected infrared light; computing tilt data based on the laser reflection and deriving an indication of an attachment defect based on the tilt data.

BRIEF DESCRIPTION OF THE DRAWINGS

The following drawings are illustrative of particular embodiments of the present disclosure and therefore do not limit the scope of the disclosure. The drawings (not to scale) are intended for use in conjunction with the explanations in the following detailed description, wherein similar elements are designated by identical reference numerals. Moreover, the specific location of the various features is merely exemplary unless noted otherwise.

FIG. 7 is a table that summarizes results of inspection carried out with the exemplary inspection system 100.

DETAILED DESCRIPTION

Figure 1:
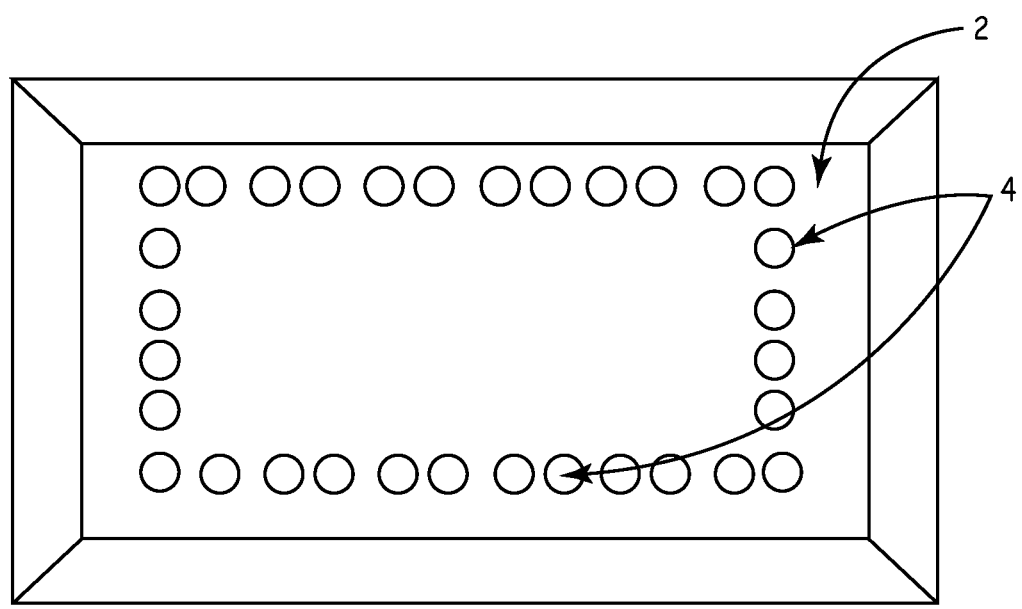
FIG. 1 is an inclined view depicting an exemplary embodiment of a component having bumps.

While the present disclosure is susceptible of embodiment in many different forms, there is shown in the drawings and will be described herein in detail specific embodiments thereof with the understanding that the disclosure is to be considered as an exemplification of the principles of the disclosure and is not intended to be limited to the specific illustrative embodiments.

The integrated circuit assembly industry has grown increasingly automated over the past decade with the use of surface-mount technology becoming dominant. In this technology, various techniques are utilized to place electrical components onto an integrated circuit board (also known as a substrate). For example, a paste of solder and flux is applied to the bare substrate by means of metal stencil and rubber squeegee. The stencil is removed, leaving solder paste "bumps" in appropriate places. Components are then placed on the bumps. The solder paste has sufficient viscosity and surface tension to hold the components to the substrates temporarily. The stuffed assemblies are then passed through an oven, which melts the solder paste and makes secure mechanical and electrical connection. Another technique, called "flip-chip" technology, affixes solder balls directly to an electrical component. The component is inverted (hence the name "flip chip") and placed directly onto the substrate. The substrate is passed through an oven to melt the solder paste and make the electrical and mechanical connection.

FIG. 1 is an inclined view depicting an exemplary embodiment of an electrical component having bumps. A plurality of bumps 4 are formed on the surface of the component 2 arranged in a pattern that is suitable for connection to a substrate (not shown) or one or more other electrical components. As indicated, the bumps 4 are provided on the surface of component 2 and used for electrical and mechanical connection of the component 2 to the substrate. While not shown herein for ease of description, it should be noted that the bumps may alternatively be formed on the substrate (not shown) rather than the component 2, or, both on the substrate and the component 2.

Figure 2:
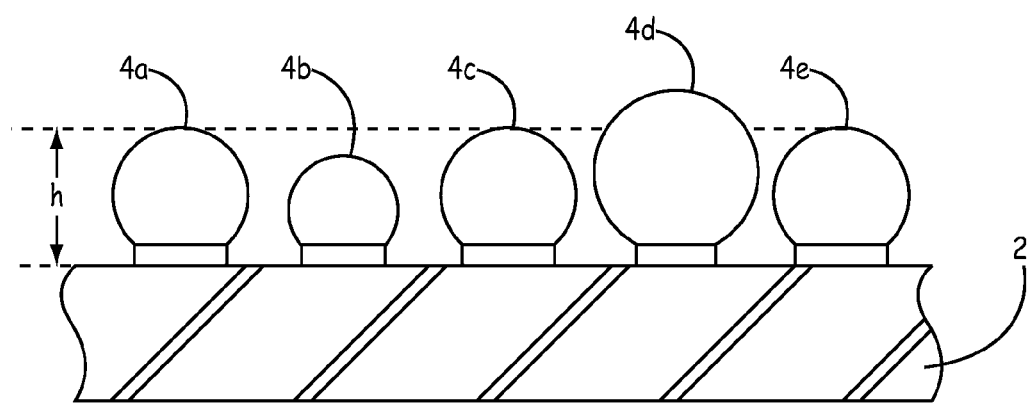
FIG. 2 is a partial cross-sectional view depicting a substrate onto which bumps are formed.

FIG. 2 is a partial cross-sectional view depicting a component onto which bumps are formed. In the exemplary embodiment, bumps 4a, 4c and 4e are formed in accordance with a set of pre-defined dimensions. In contrast, bumps 4b and 4d represent bumps that do not conform to the set of pre-defined dimensions. In this example, a comparison of bumps 4b and 4d with the set of pre-defined dimensions reveals that bump 4b is small in form and its height is less than a normal height h and bump 4d is large in form and its height is greater than the normal height h.

Along with this component placement, conventional inspection techniques of the substrate prior to the placement of components have been utilized. Conventionally, the height and size of bumps has been viewed as a proxy of bad bonding; thus, techniques have been developed to identify "abnormal" bumps such as bumps 4b and 4d and classify such bumps as resulting in bad bonding. The inspection also identifies bumps that are either shorted (meaning that two or more bumps are in electrical contract) or bumps that are open (meaning that there is an electrical disconnect between a bump and the substrate). The shorted bumps may also arise due to the presence of excess flux that causes adjacent bumps to melt together.

Nevertheless, the inspection techniques have been focused on identifying variations of the bumps from the set of pre-defined dimensions including height, shape, and/or size. However, inspecting the bumps prior to attachment of the components has numerous shortcomings. These include the fact that even after inspection of the individual bumps, defects have been observed on bumps that were initially determined to have been flawless. These defects may arise, for example, during the final assembly where component-to-substrate bonding is performed. Additionally, it is often required that a substrate be provided with numerous bumps ranging in number from a few dozen to several hundreds depending on the complexity and number of electrical components. Optical analysis of each of those bumps including analysis of each bump's dimensions can be time and resource consuming. With manufacturing processes where hundreds of circuit assemblies are manufactured by the hour, inspecting every bump on every circuit assembly can slow down the assembly process and limit overall yields. Moreover, conventional techniques of measuring individual bump dimensions require complex calibration of the measurement tools since variations among the bumps are expected.

The inventors of the present disclosure have discovered that measuring various parameters of the fully assembled integrated circuit assembly improves the identification of defects while reducing the cost and time associated with inspection of individual bumps. The discovery recognizes that any variation of the size of the bumps produced during manufacturing of the bumps may result in a problematic aspect during mounting of the electronic component. That is to say, simply determining that a bump is properly formed prior to coupling the electronic component may not in and of itself be sufficient at identifying bad bonding.

Figure 3:
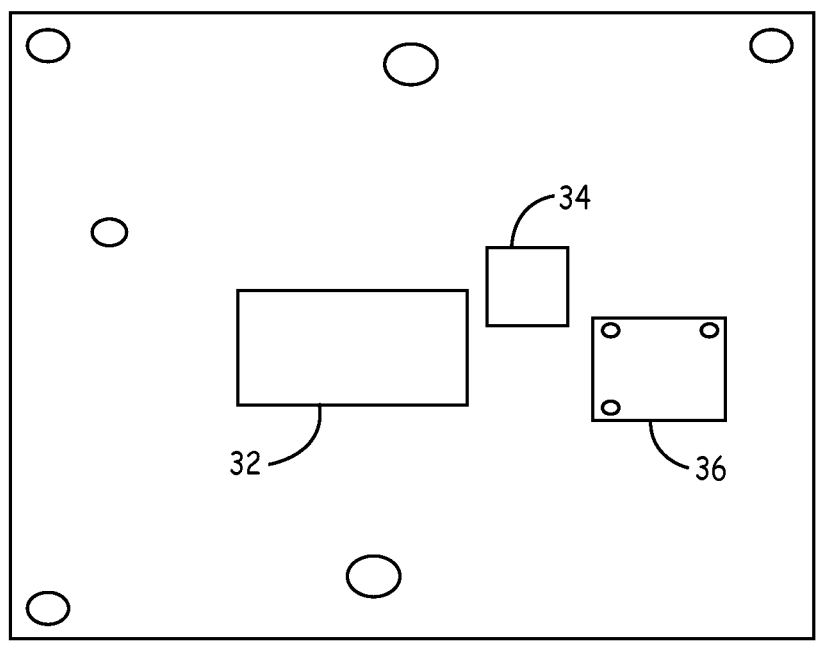
FIG. 3 is a diagram of an exemplary circuit assembly.

FIG. 3 is a diagram of an exemplary circuit assembly. The diagram in FIG. 3 depicts a circuit assembly 30 having a plurality of illustrative electrical components such as a first component 32, a second component 34, and third component 36. Numerous such electrical components (32, 34, 36) may be disposed on the substrate as is known in the art.

Figure 4:
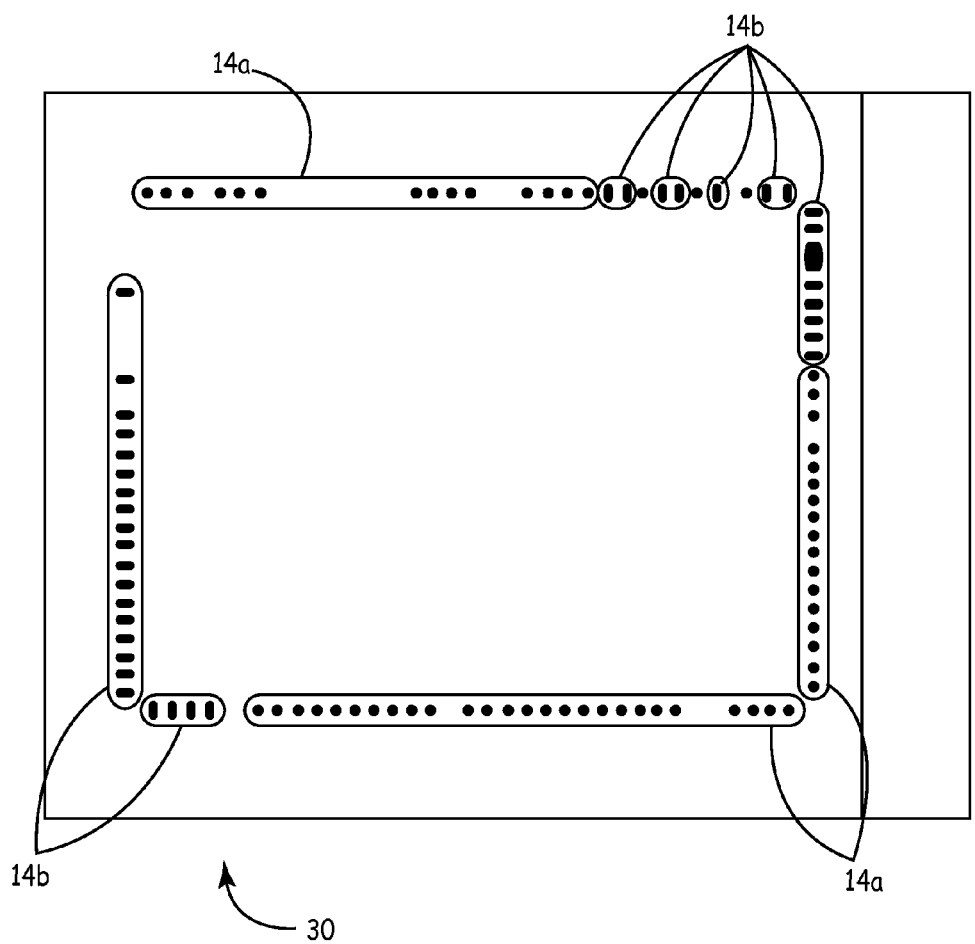
FIG. 4 illustrates a magnified x-ray image focused on a portion of a circuit assembly.

FIG. 4 illustrates a magnified x-ray image focused on the portion of circuit assembly 30 underneath second component 34 of FIG. 3. The illustration shows a plurality of bumps 14 that are arranged on the surface of the substrate 10 in a pattern coinciding with the pattern of electrical connection terminals on an electronic component (not shown). Bumps require good solder wetting to the substrate to form suitable electrical connections. Good solder wetting results in proper melting of the bumps and formation of an appropriate metallurgical bond. The illustrative image of substrate 10 that was captured after completion of the circuit assembly process shows bumps 14a having good solder wetting and bumps 14b that have non-wetted bumps. The bumps 14a with good solder wetting have an optically evident oval shaped configuration. In contrast, the non-wetted bumps which do not provide a suitable bond and generally do not adhere to the surface are observed to have a generally circular shape.

Generally, it is expected that the height and size of bumps are relative; therefore, individual variations alone will not be conclusive of whether or not there is good bonding. However, the inventors have also discovered that an attribute of the non-wet bumps is that they exhibit a noticeably higher stand-off, in relation to the wetted bumps, after the reflow process involving soldering of an electrical component. In contrast, the wetted bumps will collapse or have a lower height profile as compared to the non-wetted bumps. As such, the presence of wetted 14a and non-wet bumps 14b results in a variation in the relative surface heights of an electrical component mounted on the substrate after the reflow process. With the above observations in mind, the present disclosure describes inspection techniques for detecting defective bumps. Among other things, the disclosure provides for measurement of the height profiles of an electrical component at a plurality of spaced apart locations. Based on the above-noted observations of the dimensional differences between wetted and non-wet bumps, embodiments of the present disclosure utilize the height profile data of the electrical component as a proxy for detecting defective bumps.

In other embodiments, parameters indicative of the tilting of an electrical component may be obtained to provide an indication of defective bonding. As those skilled in the art will appreciate, utilizing the height profile data or the component tilt data as disclosed in the present disclosure to detect defective bumps and/or improper component connections provides several advantages over conventional methods of measuring individual bump geometry data. For instance the techniques of the present disclosure facilitate fast, post-production inspection of circuit assemblies which improves production efficiency. The techniques also facilitate identification of post-assembly defective circuit assemblies, a capability that is not provided by conventional inspection techniques of individual bump geometries.

Figure 5:
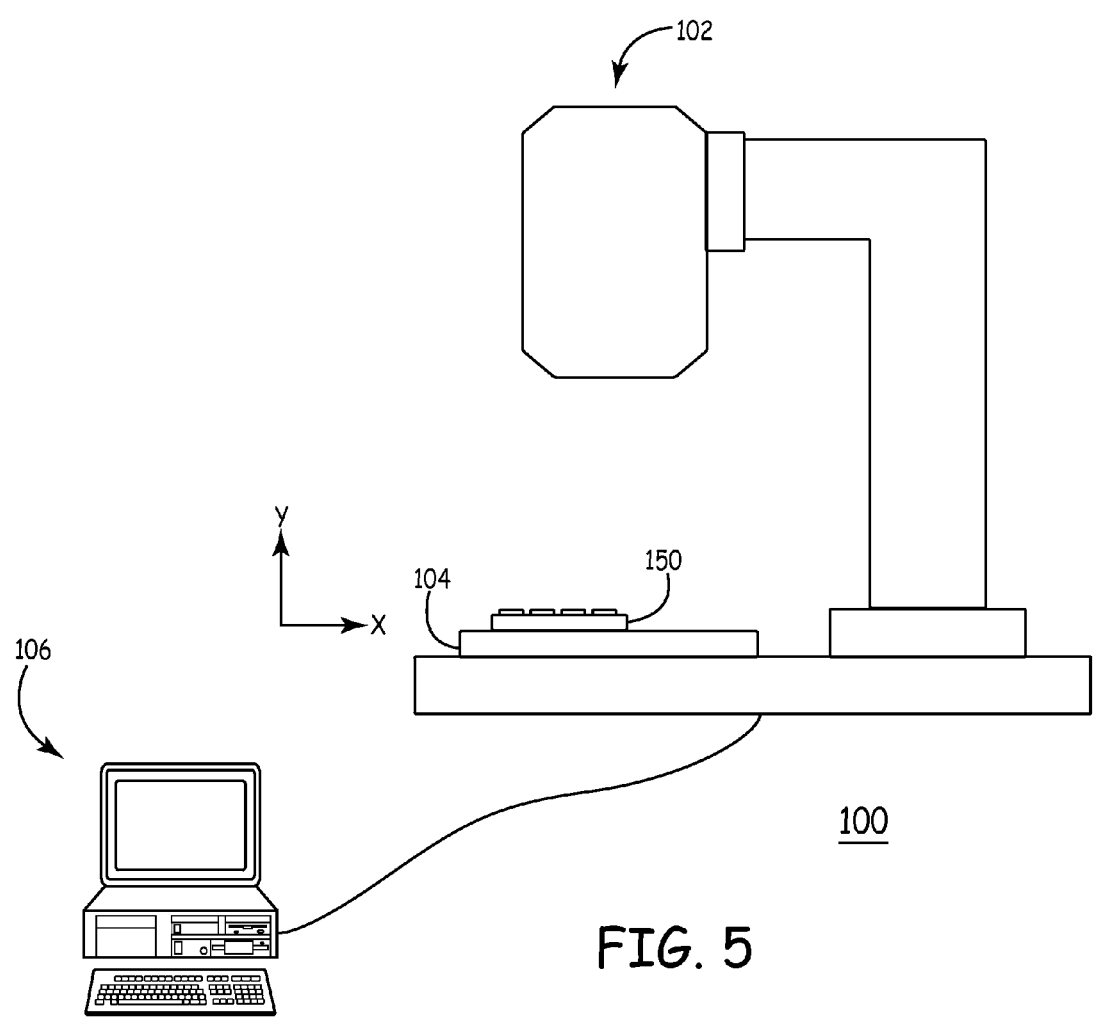
FIG. 5 is a block diagram of an exemplary embodiment of an apparatus for implementing an inspection technique in accordance with the present disclosure.

FIG. 5 is a block diagram of an exemplary embodiment of an apparatus for implementing an inspection technique in accordance with the present disclosure. It should be noted that the apparatus depicted therein is merely exemplary of one method of implementing the present disclosure and as such should not be construed as limiting. An inspection system 100 includes laser unit 102 for directing laser beams onto a surface of an integrated circuit assembly 150 to be inspected and for receiving signals representative of the reflected laser beams for deriving various dimensional characteristics of an electronic component mounted on a substrate of the integrated circuit. The inspection system 100 may include a conveyor unit 104 that may, for example, include a motion mechanism (not shown) for positioning the integrated circuit assembly 150 at different X-Y positions below the laser unit 102. The conveyor unit 104 may be controlled by a computer 106 (which includes, for example, a microprocessor and a memory device) for executing various instructions necessary to perform the inspection of an electronic component. Through manipulation of conveyor unit 104, the inspection system is capable of selectively positioning a desired component on the integrated circuit under laser unit 102 so that the various desired dimensions can be obtained. The conveyor unit 104 may also be manipulated to facilitate inspection of one-dimensional, two-dimensional, and three-dimensional profiles as desired.

Data collected by the laser unit 102 is transmitted as an analog or digital signal to the computer 106. The collected data is analyzed and the results of the analysis are reported to an operator for subsequent handling.

Figure 6:
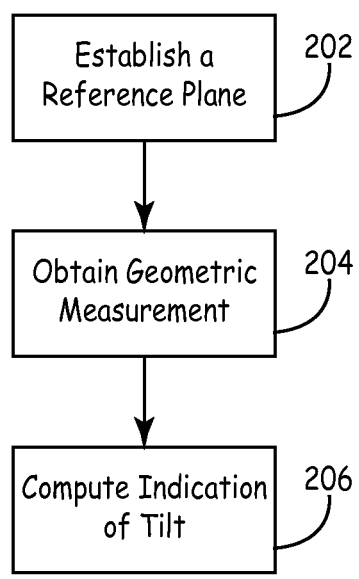
FIG. 6 is a flow diagram of an exemplary method implementing techniques to inspect and detect an attachment defect for an electrical component mounted on a substrate.

FIG. 6 is a flow diagram of an exemplary method implementing techniques to inspect and detect an attachment defect for an electrical component mounted on a substrate. FIG. 7 is a table that will be used in conjunction with the discussion of the flow diagram of FIG. 6 and summarizes results of inspection carried out with the exemplary inspection system 100. In particular, the measurements in table 1 in FIG. 7 represent the results of a test set-up that was implemented for inspection of an integrated circuit. Any metrology tool with Z height measurement such as that of the exemplary inspection system 100 can be used as die tilt metrology. In the test set-up, a Nikon NEXIV VMR-3020 measuring microscope manufactured by Nikon Instruments Inc. of Melville, N.Y. USA was used. However, any suitable general purpose coordinate measurement system may suitably be employed. The test set-up instrument had a laser beam generator and sensor for receiving reflected laser beams to enable evaluations of a surface's flatness. The Nikon measuring microscope had a laser of 685 nm (2.7 mil) wavelength, 20 us frequency, and the camera resolution in Z was 1.5 um (590 mil).

With reference to FIG. 6, step 202 of the method 200 includes establishing a reference plane on the substrate of the integrated circuit. In some embodiments, a single reference plane may be established for the entire substrate. In other embodiments, individual reference planes are preferred to be established for each inspection point at a location that is within a predetermined length of the inspection point. As such, in the exemplary embodiment of the experimental test set-up, a reference plane was established on the substrate with respect to each of the inspection points. The reference plan is generated using lean square method.

Various control limits in establishing the reference plane for each inspection point may be taken into account. For example, the determination of the predetermined length between the inspection point and the point at which the reference plane measurement is performed may affect the accuracy of the geometry measurements. Another factor is that the surface height variation of the substrate may result in variations of the reference plane from one location to another. Therefore, embodiments of the present disclosure contemplate that the reference plane may suitably be determined based on measurements performed at a plurality of locations on the substrate. For example, three points were utilized in establishing a reference plane for the test set-up. While it should be understood to be non-limiting, the three points were located within a predetermined radius in relation to the inspection point.

The choice of the location of the reference plane has an effect on the direct geometric measurement. That is, the substrate may have bowing factors such as warping or surface mismatch between the substrate and package material so that the height of the top surface of the substrate may differ from place to place. To minimize any impact resulting from the bowing factors, the proximity of the reference plane to the point on the electronic component where a measurement is made is selected to be as close as possible. Doing so substantially reduces or eliminates the impact of the substrate's bowing factors to the performed measurements and the assumption can be made that the reference plane is flat. Therefore, before obtaining the geometric measurements of the electronic component, the reference plane is established by averaging a plurality of arbitrary points in the vicinity of the electronic component to be inspected. For example, the height of three different locations proximate to the electronic component may be measured and an average height obtained by averaging the three measured heights.

Continuing on with method 200, one or more geometric measurements of an electronic component mounted on the integrated circuit is obtained at step 204. For reference, and without being intended to be limiting, geometric measurement as used in this disclosure refers to points, lines, angles, surfaces and shapes. As such, the geometric measurements may be in any desired dimension of space. Additionally, it is contemplated that one or more physical properties may be derived from the direct measurements of a geometric measurement whether in the same or different dimension. For example, a direct measurement of a linear dimension such as height, length, and width may be utilized to derive the area, volume or any other desired unit of measure. Accordingly, obtaining a geometric measurement in step 204 includes both direct measurements and, derivations of geometric measurements, in any desired dimension. The height dimensions are measured from the reference plane. That is to say, the height of a given inspection location is determined by measuring the height of the inspection point from a pre-determined point on the reference plane.

In the experimental set-up, height dimensions for a plurality of spaced apart locations on the top surface of an electronic component were obtained. The experimental set-up included a determination of the impact on accuracy of the location of the reference plane with respect to the inspection point. Specifically, the experiment considered the impact of establishing a reference plane at various pre-determined distances from the inspection point; the first being at a distance approximately 200 um (7.87 mil) away, and the second being at a distance approximately 400 um (15.75 mil) away. The height dimensions were obtained from locations adjacent at least a first vertex and a second vertex of the electronic component. It is contemplated that for components that do not have a geometry that lends itself to distinct vertices such as a circular surface profile, it would be sufficient to obtain measurements from diametrically-opposed locations.

In performing the height measurement, several techniques may be utilized. As alluded to previously, the height dimension for each of the plurality of spaced apart locations is measured relative to the reference plane. For example, a first signal having a first displacement indication may be obtained for the reference plane and a second signal having a second displacement indication may be obtained for the location on the top surface of the electronic component. The height dimension of the electronic component at the measured location relative to the reference plane may be computed from the second and first displacement indication. In other words, at least two height measurements may be computed to derive a maximum height and a minimum height, in relation to the two or more locations.

Subsequent to obtaining the heights of each of the plurality of spaced apart locations, an indication of the tilt of the electronic component is computed at step 206. The tilt may be calculated as: die tilt=maximum height of the component−minimum height of the component. The tilt data represents the deviation from the reference plane of a horizontal plane aligned with the top surface of the electronic component.

Table 1 in FIG. 7 summarizes the results of the experimental test set-up conducted to compare the accuracy of a reference plane that was established approximately 200 um (7.87 mil) away with a reference plane that was established approximately 200 um (7.87 mil) away from the inspection location. In the experiment, height measurements were performed with a first reference plane being established approximately 200 um (7.87 mil) away from the inspection point and a second reference plane being established approximately 400 um (15.75 mil) away from the inspection point. As is evidenced by the comparative test set-up measurements, the accuracy of the measurements is improved by locating the reference plane closer to the inspection point.

It should be understood that any process descriptions or blocks in flow diagram shown in FIG. 6 should be understood as representing modules, segments, or portions of code which include one or more executable instructions for implementing specific logical functions or steps in the process, and alternate implementations are included within the scope of the embodiments in which functions may be executed out of order from that shown or discussed, including substantially concurrently or in reverse order, depending on the functionality involved, as would be understood by those reasonably skilled in the art.

In obtaining the tilt values, the present disclosure utilized the height measurements of the plurality of spaced apart locations. The height at a first location on a first vertex was compared to the height at a second location on a second vertex. By comparing the relative heights of the spaced apart first and second locations on the electronic component's top surface, an indication of the degree of tilt of the electronic component can be obtained.

Figure 8:
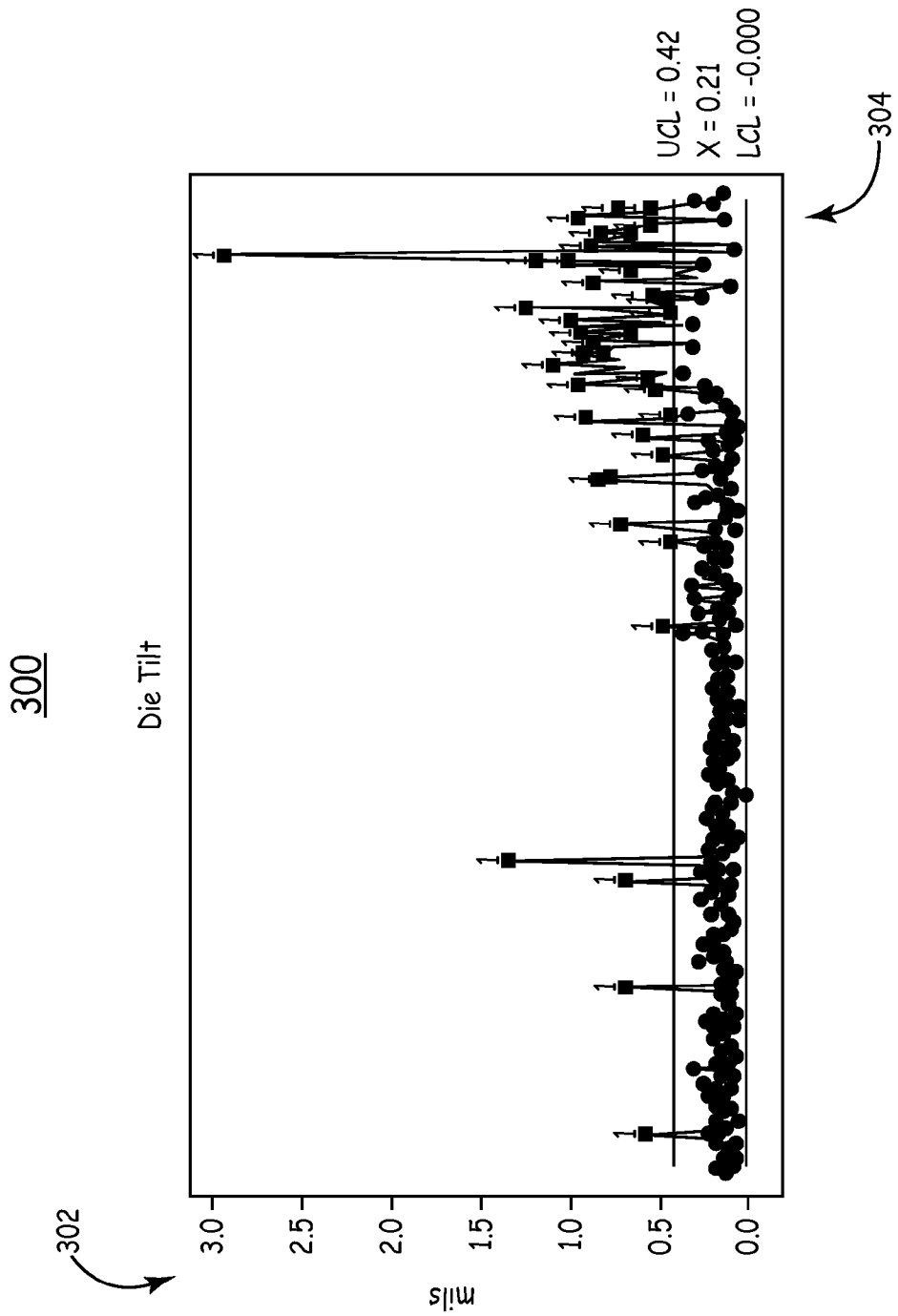
FIG. 8 is a control chart of a scatter plot of tilt data for a plurality of electronic components each mounted on a separate substrate.

FIG. 8 is a control chart of a scatter plot of tilt data for a plurality of electronic components each mounted on a separate substrate. Tilt data on a control chart 300 was compiled by performing tilt measurements for 200 sample chips to derive a template for a range of acceptable tilt measurements for an electronic component. In collecting the data, height measurements were performed as described above with a reference plane being established at a distance approximately 200 um (7.87 mil) away from each inspection point. The control chart 300 includes a vertical or y-axis 302 and a horizontal or x-axis 304. The y-axis 302 represents the individual tilt values for each electronic component in units of mils (a thousandth of an inch) and the x-axis 304 represents time at which each individual tilt value was obtained. The plotted points were collected from two-hundred electronic components, each of which was assembled onto a separate sample integrated circuit assembly. As such, the tilt values were centered at a value of 0.21 mil with an upper control limit selected at 0.42 mils and a lower control limit 0.0 mil. Thus, electronic components with tilt values falling outside a range defined by the upper class limit and the lower class limit range were considered to have a defective connection to the substrate.

The electronic components that were classified as having a defective connection were subsequently analyzed through x-ray inspection. The x-ray data confirmed the presence of the defective connections between the bump and the terminals of the electronic component.

As can be appreciated, variability in the control limits for an assortment of electronic components from the limits illustrated in control chart 300 is contemplated. For example, other integrated circuit assemblies having electronic components of different sizes, bump patterns, or bump heights may in fact have differing control limits. However, the process for establishing the control limits for a given class of components can be established by sampling multiple components.

Investigation of the scatter plot of the tilt values indicates that data obtained from different test samples has some extent of linear dependence. As such, a threshold tilt value may be established in alternative embodiments for determining defective connections.

Figure 9:
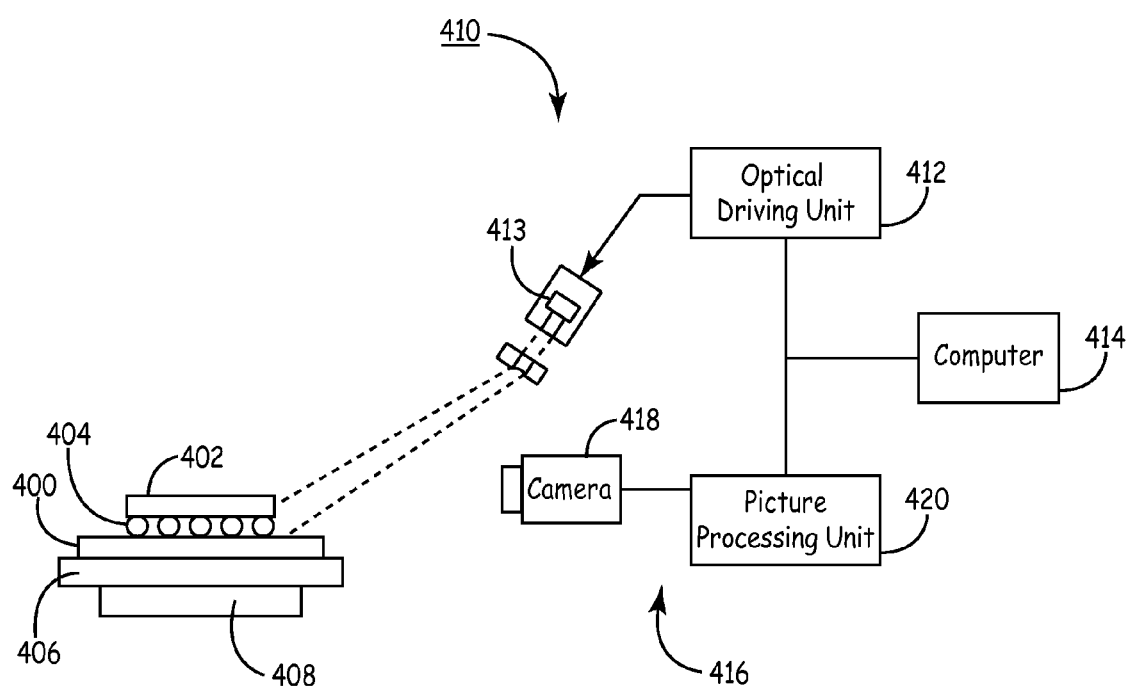
FIG. 9 illustrates an alternative embodiment for inspecting an integrated circuit assembly to detect an attachment defect.

FIG. 9 illustrates an alternative embodiment for inspecting an integrated circuit assembly to detect an attachment defect. As shown in FIG. 9, the apparatus for inspecting a coupling between a substrate 400 and an electronic component 402 comprises an imaging system 410 for capturing images of the electronic component 402. As previously described, coupling between the electronic component 402 and substrate 400 is typically achieved through solder bumps 404. The assembly of the substrate 400 to the electronic component 402 may be placed on a platform 408 that may have a moveable portion 406 to orient the assembly as desired for inspection.

The imaging system 410 includes an optical driving unit 412 having an optical generator 413. The optical driving unit 412 is controlled by computer 414 to emit light such as infrared light. An image pickup device 416 comprised of an infrared camera 418 and a picture processing unit 420 may be arranged at a location where an image of electronic component 402 can be captured.

Computer 414 controls the optical driving unit 412 and image pickup device 406 such that light is projected onto the electronic component 402 to illuminate at least a portion to be imaged. The light is projected at an angle which is oblique to the imaged portion so as to reduce interference from reflection. The infrared camera 418 is positioned such that it can detect and capture an image of the illuminated electronic component. Images of multiple portions may be captured simultaneously or separately. When data are being processed as picture information, the processing/computing duration is impacted by the quantity of captured data. Therefore, it is possible to shorten the inspection duration by controlling the infrared camera 418 to only capture limited information.

Defects in the connection of the electronic component 402 to the substrate 400 may then be determined from the captured image(s). The determination involves an analysis of the captured image(s) to derive an indication of tilt of the electronic component with respect to a reference plane established on the substrate 400.

Figure 10:
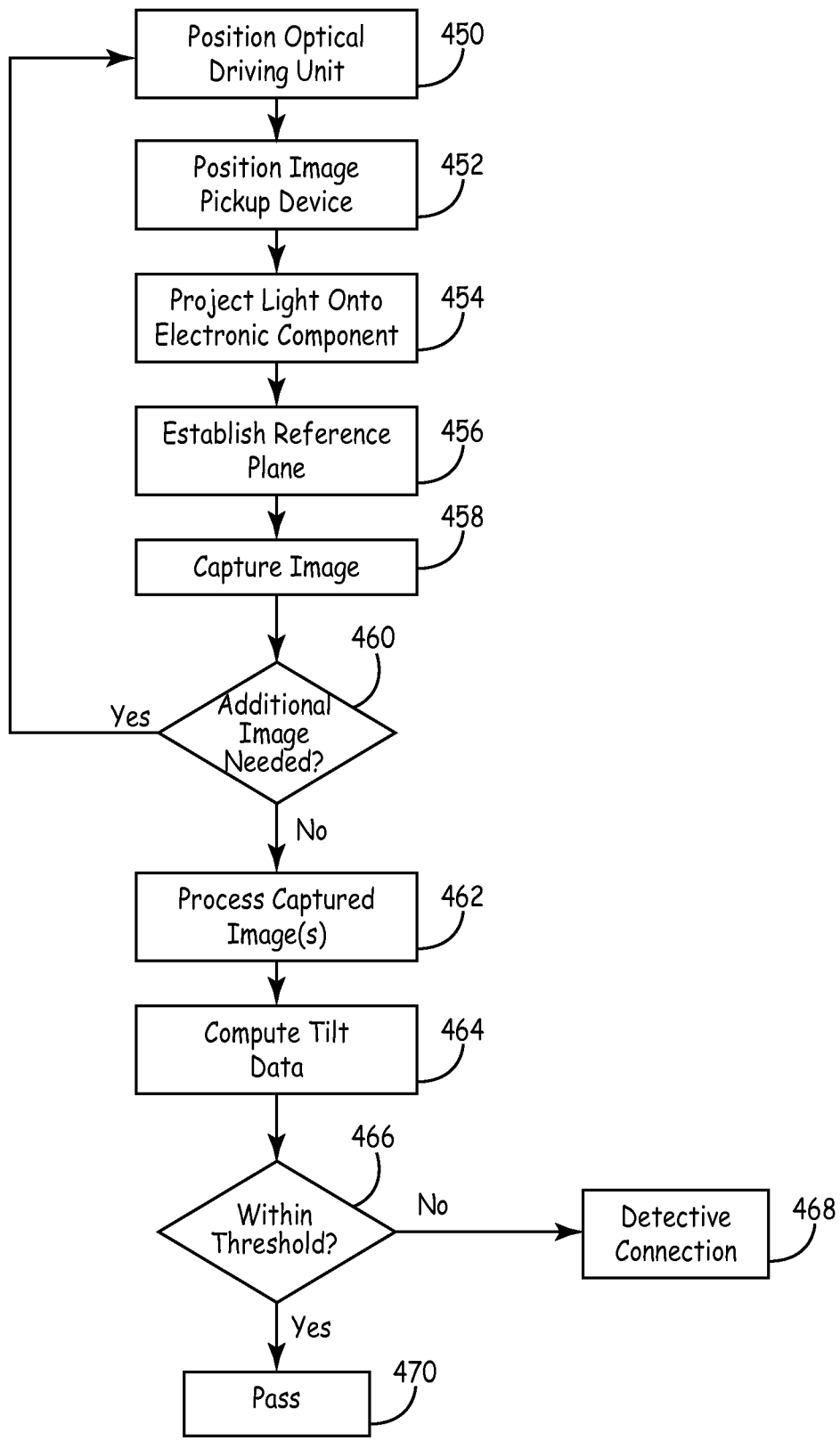
FIG. 10 is a flowchart illustrating an exemplary technique that utilizes one or more captured images to detect an attachment defect between an electronic component and a substrate based on an indication of tilt of the electronic component.

FIG. 10 is a flowchart illustrating an exemplary technique that utilizes one or more captured images to detect an attachment defect between an electronic component and a substrate based on an indication of tilt of the electronic component. Inspection of the electronic component interconnection to the substrate is performed after the electronic component is placed onto the substrate and bonded to the substrate's solder bumps. In implementing the inspection technique, hardware such as that of the imaging system of FIG. 9 may be utilized in conjunction with computer executable instructions to carry out the inspection. FIG. 10 depicts an exemplary flowchart that may be implemented in part as software that is executable by the imaging system. In the implementation utilizing the imaging system of FIG. 9, the imaging system is positioned such that infrared light is projected onto an electronic component on an integrated circuit assembly [step 450]. In one example, the light is projected such that a vertical edge of the electronic component is illuminated to permit capturing of an image of the height profile.

Next, the image pickup device is positioned to capture an image of the illuminated portion of the electronic component [step 452]. In one embodiment, the captured image is a two-dimensional planar view of a portion of the electronic component. However, in other embodiments, a three-dimensional view of a portion of the electronic component may be captured to derive data indicative of tilting of the electronic component. The process of capturing three-dimensional images may be through conventional methods such as that described in U.S. Pat. No. 7,676,114, issued to Chung et al., which is incorporated herein by reference in its entirety. The infrared light is projected [step 454] onto the desired location. An image of the desired location is then captured [step 458].

Optionally, prior to or during the process of capturing the image, it may be desirable to establish a common reference plane for the plurality of images [step 456]. While this step is optional, the reference plane has been found to affect various dimensional measurements. For example, the substrate may be warped so that the height of the top surface of the substrate may differ from place to place. Therefore, establishing a common reference plane will improve accuracy during the analytical process. Establishing a common reference plane also speeds the processing by allowing direct alignment of multiple images to detect tilt as will be described below. Although the method of FIG. 10 can be carried out with a single image, the steps 450-458 may be repeated as needed [step 460] to capture a plurality of image of the electronic component. Preferably at least two images of spaced-apart locations are captured for the inspection. Such images may, for example, be side view profiles of the electronic component to be inspected.

The two or more images are processed to determine whether the electronic component is tilted. In the exemplary embodiment, a captured image may be superimposed onto another image [step 462]. The image against which the captured image is superimposed may either be a reference image or yet another captured image. The reference image may represent an image of a similar electronic component that has been evaluated and found to be properly interconnected onto a substrate. Alternatively, two or more images of the same electronic component may suitably be superimposed. In superimposing the image, it may be desirable to align the reference planes of each image in order to improve the accuracy of the process.

In the exemplary embodiment, a result of the image processing will be a coefficient of alignment [step 464]. An exemplary coefficient may, for example, be a height offset. The coefficient of alignment will provide an indication of tilt of the imaged electronic component. Due to imperfections on the surface of the substrate, variations among the height profiles on multiple assemblies are expected. Therefore, sample integrated circuit assemblies may be used for establishing a threshold for qualifying the processing results of the captured images. For example, a sample of 200 integrated circuit assemblies may be inspected to determine whether there are any defects in the connection of electronic components thereto and derive tilt data of the electronic components. These results may be confirmed with x-ray. A range of acceptable values may be obtained and used as threshold parameters for subsequent tests. In the exemplary embodiment, a standard deviation of 1.75 um (0.07 mil) was established.

As such, the results obtained at step 464 are evaluated against a threshold range [step 466] to evaluate the integrity of the connection. Electronic components having tilt values that exceed the established threshold by a value greater than the standard deviation are classified as having a defective interconnection to the substrate [step 468] while those that fall within the threshold range are deemed to have proper connection [step 470].

The techniques described in this disclosure may be implemented, at least in part, in hardware, software, firmware or any combination thereof. When implemented in software, the functionality ascribed to the techniques described in this disclosure may be embodied as instructions on a computer-readable medium such as random access memory (RAM), read-only memory (ROM), non-volatile random access memory (NVRAM), electrically erasable programmable read-only memory (EEPROM), FLASH memory, magnetic data storage media, optical data storage media, or the like. The instructions may be executed to support one or more aspects of the functionality described in this disclosure.

It should be appreciated that the exemplary embodiments are only examples, and are not intended to limit the scope, applicability, or configuration of the disclosure in any way. Rather, the foregoing detailed description will provide those skilled in the art with a convenient road map for implementing the exemplary embodiments. It should also be understood that various changes can be made in the function and arrangement of elements without departing from the scope of the disclosure as set forth in the appended claims and the legal equivalents thereof

What is claimed is:

1. A method of detecting a defect in a coupling between a circuit board and an electronic component mounted on a top surface of the circuit board, comprising:
    measuring a plurality of differential measurements between a horizontal plane of the electronic component in relation to a plurality of reference planes, wherein:
        each of the plurality of differential measurements is performed at a different location of the electronic component,
        each of the plurality of differential measurements is associated with at least one of the plurality of reference planes, and
        each of the plurality of reference planes is established by computing an average height of a plurality of points on the top surface of the circuit board that are proximate to the electronic component to define a horizontal plane at the position of the average height;
    obtaining an indicia of tilt of the horizontal plane of the electronic component based on a difference in the measured plurality differential measurements;
    evaluating coupling between the circuit board and the electronic component based on the indication of the tilt; and
    identifying a defect in the coupling responsive to the evaluation.

2. The method of claim 1, wherein each of the reference planes is parallel to a horizontal plane defined by a portion of the top surface of the circuit board that is adjacent to the electronic component.

3. The method of claim 2, wherein each of the reference planes is defined as a plane that is disposed at a distance within a range of 20 um to 600 um from an external edge of the electronic component.

4. The method of claim 1, wherein obtaining the indicia of tilt comprises:
    measuring a first dimension for a reference plane, and a second dimension of the electronic component relative to the reference plane;
    computing a difference between the first dimension and the second dimension; and
    deriving an indication of whether the electronic component is tilted in relation to the reference plane based on the measured first and second dimensions.

5. The method of claim 4, wherein each of the first and second dimensions comprise a height measurement of the electronic component in relation to the reference plane.

6. The method of claim 4, wherein the first measured dimension is a first vertex of the electronic component and the second measured dimension is a second vertex of electronic component spaced apart from the first vertex.

7. The method of claim 6, wherein the electrical connection is determined to be defective in response to the first measured dimension of the first vertex exceeding the second measured dimension of the second vertex.

8. The method of claim 7, further comprising measuring at least a third dimension of the electronic component in response to the determination of a defect wherein the third dimension is employed to confirm the presence of the defect.

9. The method of claim 4, wherein deriving the indication comprises comparing the first dimension to the second dimension to determine whether the difference exceeds a predetermined value.

10. The method of claim 1, wherein evaluating the metric comprises determining whether the computed indication of tilt of the surface mount electronic component corresponds to a value within a predetermined range.

11. The method of claim 1, wherein the reference plane is established by averaging a plurality of heights on the top surface of the circuit board.

12. The method of claim 1, wherein obtaining the indicia of tilt comprises:
    generating an image corresponding to a horizontal plane of the electronic component;
    comparing said generated image to at least one reference image; and
    providing the indicia of tilt of the electronic component responsive to the results of the comparison.

13. A method of detecting a defect in a coupling between a circuit board and an electronic component mounted on a top surface of the circuit board, comprising:
    generating a first image of a first location on the electronic component;
    generating a second image of a second location on the electronic component;
    obtaining an indicia of tilt of the electronic component in response to a correlation between the first image and a first reference plane and a correlation between the second image and a second reference plane, wherein:
        the first reference plane is defined for the first location and the second reference plane is defined for the second location and the first reference plane is established by computing a first average height of a plurality of points on the circuit board that are proximate to the electronic component at the first location to define a horizontal plane at the position of the first average height, and the second reference plane is established by computing a second average height of a plurality of points on the circuit board that are proximate to the electronic component at the second location to define a horizontal plane at the position of the second average height; and evaluating a metric of defect in the coupling between the electronic component and the circuit board based on the indication of tilt.

14. The method of claim 13, wherein obtaining the indicia of tilt comprises superimposing the first and second image to derive a metric of correlation.

15. The method of claim 13, wherein the first image corresponds to a first vertical edge of the electronic component and the second image corresponds to a second vertical edge of the electronic component.

\* \* \* \* \*